(12) United States Patent
Shangguan

(10) Patent No.: US 6,476,332 B1
(45) Date of Patent: Nov. 5, 2002

(54) CONDUCTOR SYSTEMS FOR THICK FILM ELECTRONIC CIRCUITS

(75) Inventor: Dongkai Shangguan, San Jose, CA (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/952,265

(22) Filed: Sep. 12, 2001

(51) Int. Cl.[7] ................................................ H01R 9/09
(52) U.S. Cl. ...................... 174/261; 174/250; 29/842; 301/779; 427/90
(58) Field of Search ................................ 174/250, 261, 174/260, 257; 427/96; 257/734; 361/779; 439/78; 29/842, 845

(56) References Cited

U.S. PATENT DOCUMENTS

| | | |
|---|---|---|
| 4,130,722 A | 12/1978 | Levijoki |
| 4,245,210 A | 1/1981 | Landry et al. |
| 4,262,532 A | 4/1981 | Butler et al. |
| 4,413,051 A | 11/1983 | Thomas |
| 4,508,754 A * | 4/1985 | Stepan ........................ 427/96 |
| 4,728,534 A | 3/1988 | Ho et al. |
| 5,084,323 A | 1/1992 | Nagasaka et al. |
| 5,178,685 A * | 1/1993 | Borenstein et al. .......... 257/734 |
| 5,246,882 A | 9/1993 | Hartmann |
| 5,442,145 A * | 8/1995 | Imai et al. ................... 174/260 |
| 5,485,352 A | 1/1996 | Shibuya et al. |
| 5,709,927 A | 1/1998 | Miyase et al. |
| 5,898,359 A | 4/1999 | Ellis |
| 5,928,568 A | 7/1999 | Paszkiet et al. |
| 5,928,968 A * | 7/1999 | Paszkiet et al. .............. 174/257 |
| 6,143,355 A * | 11/2000 | Walsh et al. .................... 427/8 |

* cited by examiner

Primary Examiner—Albert W. Paladini
(74) Attorney, Agent, or Firm—Brinks Hofer Gilson & Lione

(57) ABSTRACT

A thick film electronic circuit is disclosed. The circuit includes a substrate for supporting the circuit and a conductive trace for interconnecting a plurality of electronic devices dispersed on the thick film electronic circuit. The conductive trace includes a bonding pad for interconnecting at least one of the plurality of electronic devices to the conductive trace using solder. Moreover, the conductive trace is comprised of palladium silver and the bonding pad is comprised of silver completely covered with solder.

19 Claims, 4 Drawing Sheets

CONDUCTOR SYSTEMS FOR THICK FILM ELECTRONIC CIRCUITS

TECHNICAL FIELD

The present invention relates to thick film electronic circuits and systems and methods for creating such circuits using lead free solder.

BACKGROUND OF THE INVENTION

Thick film electronic modules are an extremely important family of electronic products, especially in the automotive industry. Thick film technology has become indispensable in the automotive environment since thick film electronic circuits can withstand higher temperatures characteristic of the automotive operating environment and since the values of the conductors and resistors may be very precisely controlled. Many automotive applications utilize thick film products such as mass air flow sensors which operate in the extremely harsh environment of a vehicle's engine compartment.

A thick film electronic circuit is typically created by first applying inks to a ceramic substrate using silk screening or similar printing methods. Conductive traces, resistors, and dielectrics may be formed from the conductor, resistor, and dielectric inks, respectively, on the ceramic substrate. An ink for the conductor is typically made of conductive particles, typically made of metals or alloys, mixed with other additives in a suspension. These additives serve to facilitate the deposition of the ink onto the substrate, typically by printing, and the adhesion of the conductor to the substrate after drying and firing. Similarly, resistor and dielectric inks are typically made of resistive particles and dielectric particles, respectively, mixed with other additives for the same purpose of facilitating deposition of the ink and adhesion to the substrate. Typically, materials such as alumina ($Al_2O_3$) are suitable ceramic substrate materials. After, for example, the conductor ink is printed on the substrate according to the circuit design, the substrate is then dried and fired in an oven to form the conductor trace on the substrate. Resistors and dielectric elements are formed similarly using resistive and dielectric inks, respectively, on the substrate. Solder paste, typically made of particles of solder alloys in a flux vehicle, is then deposited (by screen printing) onto conductor pads (which are integral with the conductive circuitry on the substrate), and then electronic components are placed on the conductive pads. The component/substrate assembly is then placed in a reflow oven having a prescribed temperature-time profile. During the reflow process, the solder melts and interacts with the conductor and component terminations. Thereafter, the solder cools down and solidifies to form an interconnect between the conductor and the component, forming the electronic module. Generally, the solder is an alloy primarily containing tin and lead. Typically, tin-lead solder having compositions of 63% tin; 37% lead or 62% tin; 36% lead; 2% silver (all percentages are by weight) is used.

Unfortunately, while prior art systems and method for creating thick film circuitry achieve their intended purpose, significant problems still exist. For example, the lead (Pb) in the tin (Sn) lead solder is known to be extremely toxic to the environment. To overcome this concern, much effort has been expended to develop a lead-free solder alloy. Presently, the automotive industry has selected a tin-silver (Ag) alloy having the composition of 96.5% tin and 3.5% silver by weight; various variations of the Sn—Ag alloy, such as tin-silver-copper (Cu) (for example 95.5% Sn, 3.9% Ag, and 0.6% Cu by weight), may also be used.

Currently, there are primarily two types of conductors used to create thick film electronic circuits. One type is made of palladium silver (Pd—Ag) and the other type is made of silver (Ag). Typically, palladium-silver conductors having approximately, a one to three palladium to silver ratio and having other minor additives are used. The palladium-silver conductor has been a typical choice for thick film products. Unfortunately, extensive metallurgical interdiffusion occurs between the Pd—Ag conductor and the tin based solder. This occurs primarily due to the existence of Pd in the conductor. Such metallurgical interdiffusion has a serious adverse impact on the reliability of the interconnection. For example, if extensive interdiffusion occurs between the solder and the conductor, adhesion between the solder, conductor, and ceramic substrate is severely compromised. Under normal thermomechanical loading, which occurs during normal vehicle operation, cracks are initiated and propagate through the interconnect leading to electrical failure.

One prior art solution has been to print and reflow a high lead solder (such as 10% tin; 90% lead or 10% tin; 88% lead; 2% silver by weight) as an interdiffusion barrier layer between the conductor and eutectic tin lead solder. Unfortunately, it is not viable to interconnect a component directly with the high lead solder since the high lead solder's melting temperature requires a high soldering temperature that could severely damage the components rendering the electronic circuitry inoperable. Further, while the high-lead barrier layer solves the interdiffusion problem, this method may not be used in lead free solder applications because of the high (90%) lead content.

Other prior art solutions to address the problems stated above have been to use silver as a conductive material. Silver has been shown to not induce extensive interdiffusion with the tin based solder due to the absence of palladium in the conductor. An added benefit is that a silver conductor is less costly than the palladium silver conductor (palladium is very expensive and is in short supply, major sources of palladium exist in Russia). One significant problem, however, exists using a silver conductor. Silver reacts with sulfur, which is present in the automotive environment. Sulfur converts the silver into silver sulfide which is non-conductive. The end result is electrical failure and the circuit is seen as an open, again rendering the electronic module inoperable. Significant numbers of warranty returns have been experienced in the automotive industry due to silver sulfide formation.

Therefore, there is a need for a new and improved system and method for attaching electronic components to a thick film circuit. Such a new and improved system and method must address toxicity concerns of using a lead-based solder, must reduce or eliminate metallurgical interdiffusion, and reduce or eliminate silver sulfide formation when using a silver conductor.

BRIEF SUMMARY OF THE INVENTION

The present invention overcomes the problems stated above and other problems not addressed by the prior art by providing a system and method for attaching electrical components to thick film circuits.

In an embodiment of the present invention, a silver conductor pad is provided where solder paste will be deposited and electronic components placed. Further, to prevent silver sulfide formation, the silver conductor pad will be completely covered with solder by over-printing the pad with solder. Thus, no silver will be exposed to react with sulfur, thereby preventing silver sulfide formation. A palladium-silver conductor material is used for the rest of the conductor traces, thus also preventing silver sulfide formation. Since the palladium-silver conductor is not used for the solder pad area, no solder/conductor interdiffusion will occur.

Preferably, in another embodiment of the present invention, the conductor traces will have a thickness of 5–30 microns.

Preferably, in another embodiment of the present invention, the solder paste is 96.5% tin and 3.5% silver (by weight) thus eliminating the use of lead. Further, the solder paste is printed with a thickness of 50–300 microns. Once the solder paste is printed, the electronic components are placed onto the solder paste. The populated assembly is then processed in a reflow oven having a prescribed temperature-time profile.

Preferably, in yet another embodiment of the present invention, the reflow temperature-time profile will include a peak temperature of 225–280° C., will have a dwell time of about 20–150 seconds at 221° C., and a ramp rate (heating/cooling) of below 10° C. per second.

In still another embodiment of the present invention, the atmosphere of the reflow process may be ambient air. However, in yet another embodiment of the present invention, a nitrogen atmosphere is preferable and will lead to more beneficial results.

Thus, the present invention eliminates the need for lead based solder for thick film electronic products, prevents failures due to extensive interdiffusion, and eliminates silver sulfide formation. Moreover, the present invention eliminates the need for a high-lead barrier layer and thus the associated process complexity, cost, and toxicity concerns.

Further objects, features and advantages of the invention will become apparent from consideration of the following description and the appended claims when taken in connection with the accompanying drawings.

DETAILED DESCRIPTION OF THE INVENTION

Figure 1:
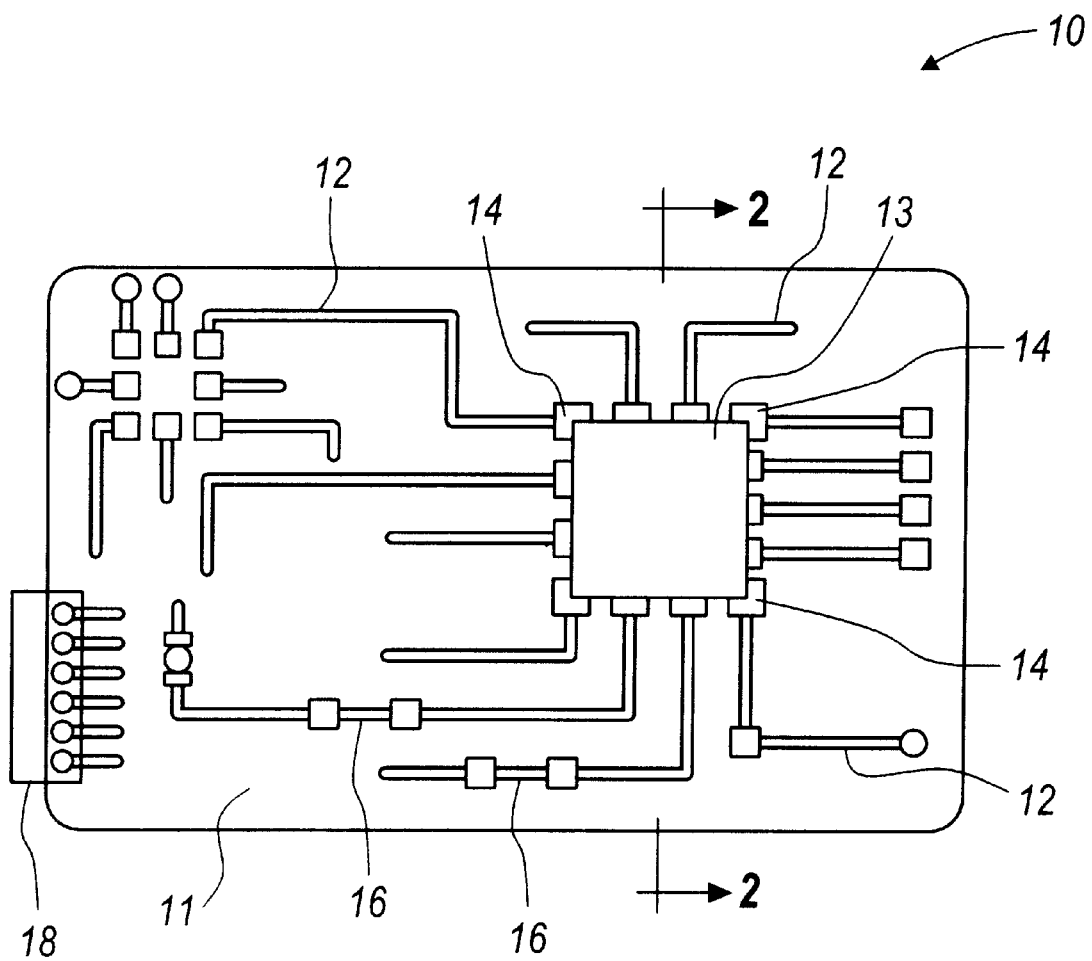
FIG. 1 is a perspective view of an electronic circuit board constructed, in accordance with the present invention.

Referring now to FIG. 1, an electronic circuit board constructed in accordance with the method of the present invention is illustrated. Printed circuit board 10 includes a substrate 11 and a plurality of circuit traces 12 formed thereon which interconnect various electronic components 13. Generally, traces 12 terminate at a bonding pad 14. A plurality of bonding pads 14 are typically arranged to facilitate bonding to electronic devices, such as integrated circuits and the like. Circuit traces 12, may of course, terminate at other electrical devices such as resistors 16 and/or electrical connectors 18.

More specifically, circuit board 10 is created using thick film technology wherein various thick film inks are utilized to create conductors, resistors, and dielectrics on a ceramic substrate, such as alumina or $Al_2O_3$. After the thick film inks are applied to the substrate, the ink is dried and fired to form the electronic circuitry. Solder paste is then deposited by, for example, screen printing onto the bonding pads.

In a preferred embodiment of the present invention, conductive traces 12 are formed from a palladium silver alloy. Thus, the present invention prevents silver-sulfide formation through the use of the palladium silver alloy. Typically, conductive traces 12 will have a thickness of 5–30 microns. In accordance with another embodiment of the present invention, bonding pads 14 are made of silver to form an effective electrical interconnect. As illustrated in FIG. 1, circuit board 10 may include a plurality of bonding pads 14 on which electronic components 13 or modules are interconnected. Further, other discrete components such as resistor 16 may also exist throughout the circuit. Generally, connector 18 interconnects the circuit with external devices. Alternatively, the palladium silver conductor traces may be formed to extend to and cover the bonding pad locations, and then silver bonding pads are formed on top of the. conductor traces at the designated locations.

Figure 2:
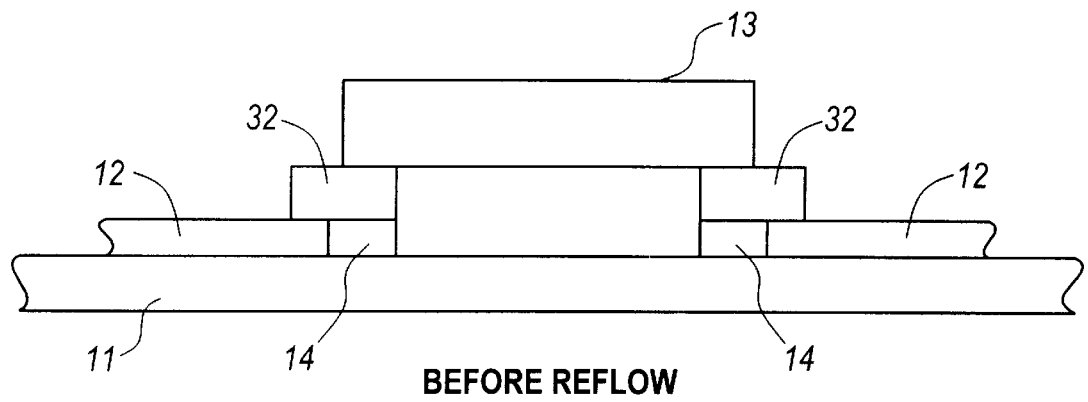
FIG. 2 is a cross-sectional view of the electronic circuit board at a location indicated in FIG. 1, in accordance with the present invention.
Figure 3:
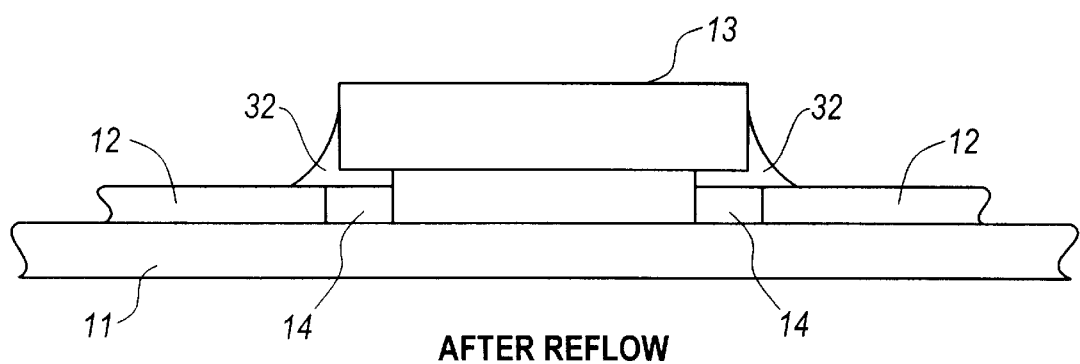
FIG. 3 is a cross-sectional view through the electronic circuit board at a location indicated in FIG. 1, after the circuit board has been processed through a reflow oven.
Figure 4:
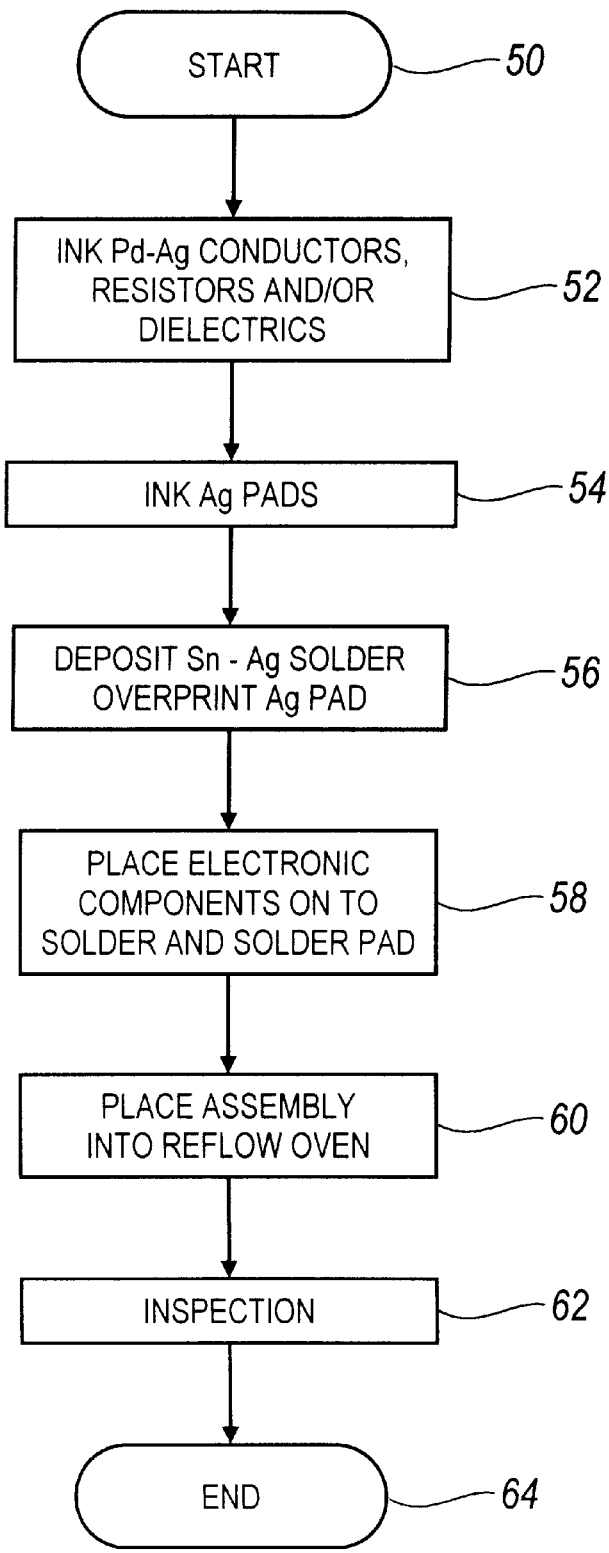
FIG. 4 is a flow diagram illustrating a method for creating an electronic circuit board, in accordance with the present invention.

Referring now to FIG. 2 through 4, a method for forming thick film electronic circuits is illustrated, in accordance with the present invention. Electronic component 13 is electrically and mechanically secured to substrate 11 using a solder paste 32. FIG. 2, specifically, illustrates the attachment of component 13 to substrate 11 after the solder paste has been applied to the silver bonding pads 14, and before the assembly has been placed in a reflow oven. As illustrated in FIG. 2, solder paste 32 is deposited onto bonding pad 14 such that the entire bonding pad area is covered by the solder paste. The solder paste is preferably a tin silver alloy printed to a thickness of approximately 50–300 microns. In a preferred embodiment of the present invention, the solder paste is 96.5% tin and 3.5% silver (by weight).

The present invention prevents silver sulfide formation by overprinting the bonding pads 14 with the tin silver solder paste. Accordingly, after solder paste is deposited on the bonding pads, electronic components 13 may be placed thereon. FIG. 3 illustrates the component 13 and substrate 11 assembly after the assembly has been processed through a reflow oven.

Specific reference is now made to FIG. 4 which illustrates in flow chart form a method for forming a thick film electronic circuit, in accordance with the present invention. The process is initiated at block 50. The palladium silver conductive traces 14 and other discreet electronic components are inked onto substrate 11 using conventional methods such as silk screening, and dried and fired, as represented by block 52. At block 54, bonding pads 14 are inked using a pure or substantially pure silver material as the conductive ingredient in the ink, and dried and fired. The exact sequence of screening, drying, and firing each of the conductor traces, bonding pads, resistors, and dielectrics, etc., may be determined taking into account the practical circumstances. Solder paste 32 comprised of a tin silver alloy is deposited onto bonding pads 14 such that the entire bonding pad surface is covered by the solder paste, as represented by block 56. As represented by block 58, electronic components and other electrical devices are placed onto circuit board 10 over the solder paste. The entire assembly is then placed into a reflow oven to first liquefy the solder 32, and then cool the solder to solidify and form interconnects with the components, as represented by block 60. At block 62, after the assembly has been removed from the reflow oven, the assembly may be inspected. The process is now complete as represented by block 64.

Figure 5:
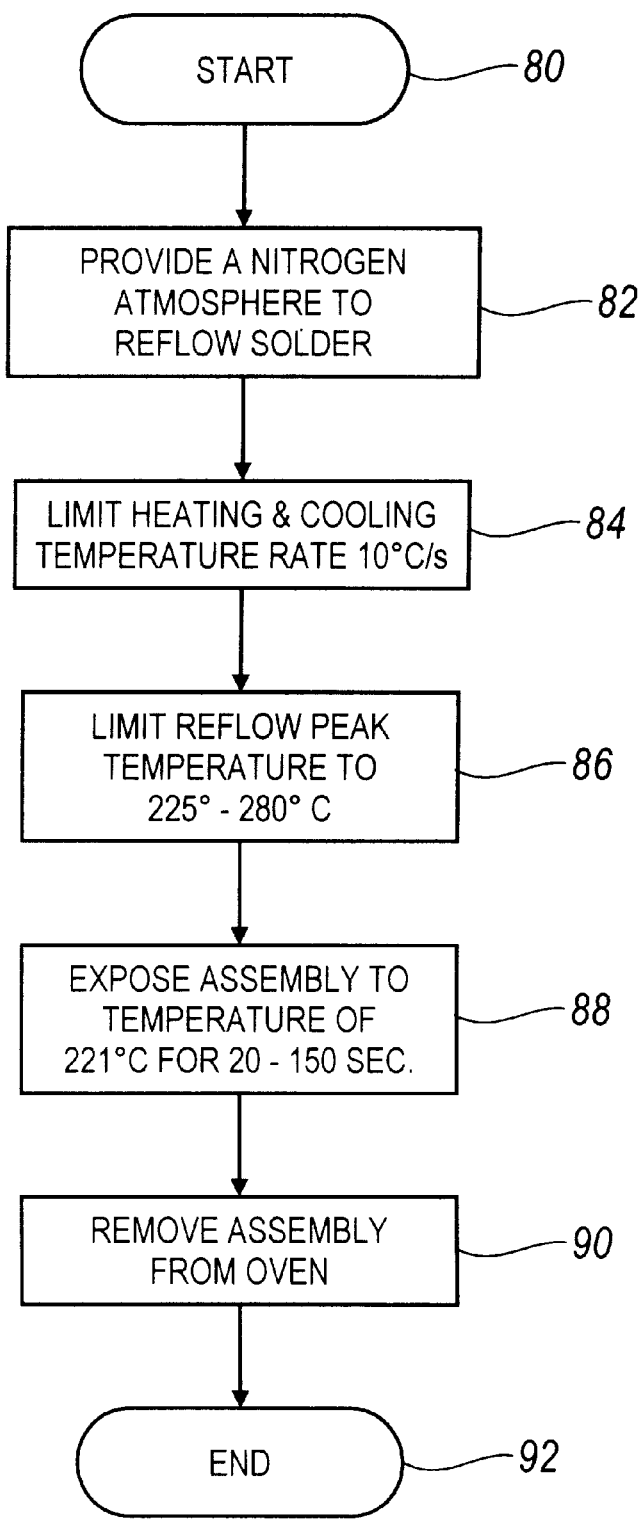
FIG. 5 is a flow diagram illustrating a method for heating the electronic circuit board to reflow the solder paste, in accordance with the present invention.

Referring now to FIG. 5, a flow chart illustrating the reflow process is illustrated in greater detail, in accordance with the present invention. The process is initiated at block 80. In a preferred embodiment of the present invention, the circuit board assembly is placed in a nitrogen atmosphere for the entire reflow process, as represented by block 82. Heating and cooling of the circuit assembly is limited to a ramp rate of approximately 10° C. per second, as represented by block 84. Further, the oven temperature is monitored to ensure that the peak temperature of the oven does not exceed 225–280° C., as represented by block 86. At block 88 the assembly is exposed toga temperature of 221° C. for approximately, 20 to 150 seconds to melt the solder, and then cooled to solidify the solder forming interconnects with the components. The assembly is then removed from the oven, as represented by block 90. The reflow process is now complete, as represented by block 92.

The present invention. has many advantages and benefits over the prior art. For example, the present invention prevents silver sulfide formation and thus electrical failures by over-printing the silver bonding pads with a tin-silver solder. Moreover, the present invention addressed the environmental concerns/issues of using a lead based solder by using the disclosed tin-silver solder.

The foregoing discussion discloses and describes a preferred embodiment of the invention. One skilled in the art will readily recognize from such discussion, and from the accompanying drawings and claims, that changes and modifications can be made to the invention without departing from the true spirit and fair scope of the invention as defined in the following claims.

What is claimed is:

1. A thick film electronic circuit, comprising:

a substrate for supporting the circuit; and a conductive trace for interconnecting a plurality of electronic devices dispersed on the thick film electronic circuit, and wherein the conductive trace includes a bonding pad for interconnecting at least one of the plurality of electronic devices to the conductive trace, and wherein the conductive trace is comprised of palladium silver and the bonding pad is comprised of silver.

2. The circuit of claim 1 wherein the substrate is alumina or $Al_2O_3$.

3. The circuit of claim 1 wherein the conductive trace includes a conductive ink.

4. The circuit of claim 1 further comprising a solder paste for interconnecting the plurality of electronic devices to the bonding pads.

5. The circuit of claim 4 wherein the solder paste is comprised of tin and silver.

6. The circuit of claim 4 wherein the solder paste is comprised of tin, silver, and copper.

7. The circuit of claim 4 wherein the solder paste is comprised of approximately 95% tin and approximately 5% silver by weight.

8. The circuit of claim 4 wherein the solder paste is comprised of approximately 95.5% tin, 3.9% silver, and 0.6% copper by weight.

9. The circuit of claim 4 wherein the solder paste covers an entire surface area of the bonding pad.

10. A method for interconnecting an electronic device to a thick film electronic circuit, the method comprising:

supporting the electronic circuit using a substrate;

creating a plurality of conductive traces on the substrate to interconnect a plurality of electronic devices, wherein the plurality of conductive traces have a plurality of bonding pads for attaching the devices thereto;

depositing a solder paste onto the bonding pads;

placing at least one of the plurality electronic devices to the bonding pads having the solder paste deposited thereon; and reflowing the solder paste to form an interconnect between the device and the bonding pad.

11. The method of claim 10 wherein the substrate is alumina.

12. The method of claim 10 wherein creating conductive traces further comprise depositing conductive ink to form the conductive traces.

13. The method of claim 10 wherein the conductive traces are palladium silver.

14. The method of claim 10 wherein the bonding pads are silver.

15. The method of claim 10 wherein the solder paste is approximately 95% tin and approximately 5% silver by weight.

16. The method of claim 10 wherein reflowing the solder paste further comprise placing the circuit in a reflow oven having a maximum temperature of between 225 and 280° C.

17. The method of claim 10 wherein reflowing the solder paste further comprises placing the circuit in a reflow oven for between 20–150 seconds at a temperature of approximately 221° C.

18. The method of claim 10 wherein depositing a solder paste further comprises covering an entire area of the bonding pads with the solder paste.

19. The method of claim 10 wherein creating a plurality of conductive traces further comprises forming the traces from a palladium silver alloy and then forming silver bonding pads on top of the plurality of conductor traces.

* * * * *